United States Patent
Usami et al.

(10) Patent No.: US 7,230,337 B2
(45) Date of Patent: Jun. 12, 2007

(54) SEMICONDUCTOR DEVICE INCLUDING LADDER-SHAPED SILOXANE HYDRIDE AND METHOD FOR MANUFACTURING SAME

(75) Inventors: Tatsuya Usami, Kanagawa (JP); Takashi Ishigami, Kanagawa (JP); Tetsuya Kurokawa, Kanagawa (JP); Noriaki Oda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 141 days.

(21) Appl. No.: 10/760,554

(22) Filed: Jan. 21, 2004

(65) Prior Publication Data
US 2004/0173910 A1 Sep. 9, 2004

(30) Foreign Application Priority Data
Jan. 31, 2003 (JP) ............................. 2003-024281

(51) Int. Cl.
H01L 23/48 (2006.01)
H01L 23/29 (2006.01)
H01L 23/28 (2006.01)
H01L 23/52 (2006.01)
H01L 23/532 (2006.01)

(52) U.S. Cl. ............................. 257/758; 257/E23.119; 257/E23.144; 257/760; 257/761; 257/762; 257/774; 257/751; 257/754

(58) Field of Classification Search ........ 257/E23.199, 257/E23.144, 758–762, 751, 753
See application file for complete search history.

(56) References Cited

U.S. PATENT DOCUMENTS 4,981,530 A 1/1991 Clodgo et al.
5,286,572 A * 2/1994 Clodgo et al. ............... 428/447
5,302,198 A * 4/1994 Allman ................... 106/287.16
5,484,687 A * 1/1996 Watanabe et al. ........... 430/296
5,506,177 A 4/1996 Kishimoto et al.
5,877,080 A * 3/1999 Aoi et al. .................... 438/622
5,906,859 A * 5/1999 Bremmer et al. ........... 427/226
5,932,679 A * 8/1999 Noto et al. .................... 528/39
5,949,130 A * 9/1999 Fukuyama et al. ......... 257/632
6,133,137 A 10/2000 Usami
6,214,748 B1 * 4/2001 Kobayashi et al. ......... 438/782
6,340,435 B1 * 1/2002 Bjorkman et al. ............ 216/72
6,558,755 B2 * 5/2003 Berry et al. ................. 427/489
6,576,300 B1 * 6/2003 Berry et al. ................. 427/489
6,576,345 B1 * 6/2003 Van Cleemput et al. .... 428/447
6,613,834 B2 9/2003 Nakata et al.
6,730,594 B2 * 5/2004 Noguchi et al. ............. 438/653
6,818,552 B2 * 11/2004 Daniels et al. .............. 438/638

(Continued)

FOREIGN PATENT DOCUMENTS

JP 07-240460 9/1995

(Continued)

Primary Examiner—Alexander Oscar Williams
(74) Attorney, Agent, or Firm—Foley & Lardner LLP

(57) ABSTRACT

The present invention reduces the effective dielectric constant of the interlayer insulating film while inhibiting the decrease of the reliability of the semiconductor device, which otherwise is caused by a moisture absorption. A copper interconnect comprising a Cu film 209 is formed in multilayer films comprising a L-Ox™ film 203 and a SiO$_2$ film 204. Since the L-Ox™ film 203 comprises ladder-shaped siloxane hydride structure, the film thickness and the film characteristics are stable, and thus changes in the film quality is scarcely occurred during the manufacturing process.

8 Claims, 18 Drawing Sheets

U.S. PATENT DOCUMENTS

| | | |
|---|---|---|
| 6,958,525 B2 | 10/2005 | Nakata et al. |
| 6,995,439 B1* | 2/2006 | Hill et al. ................... 257/396 |
| 2001/0051447 A1 | 12/2001 | Usami |
| 2002/0156180 A1* | 10/2002 | Yamada et al. ............. 524/588 |
| 2002/0173138 A1* | 11/2002 | Miyajima et al. ........... 438/622 |
| 2003/0047539 A1* | 3/2003 | Ma et al. ...................... 216/89 |
| 2003/0079416 A1* | 5/2003 | Ma et al. ...................... 51/307 |
| 2005/0124168 A1* | 6/2005 | Nagahara et al. ........... 438/745 |
| 2006/0119253 A1* | 6/2006 | Carter et al. ................ 313/503 |

FOREIGN PATENT DOCUMENTS

| | | |
|---|---|---|
| JP | 10-199883 | 7/1998 |
| JP | 11-087332 | 3/1999 |
| JP | 2001-326222 | 11/2001 |
| JP | 2001-345317 | 12/2001 |
| JP | 2002-134506 | 5/2002 |

* cited by examiner

FIG. 5

| | |
|---|---|
| DIELECTRIC CONSTANT (at 1 MHz) | 2.9 |
| REFRACTIVE INDEX (at 633 nm) | 1.39 |
| STRESS (dyne/cm$^2$) | 7.00 X 10$^8$ |
| HARDNESS (GPa) | 0.9 |
| ELASTICITY (GPa) | 6 |
| THERMAL EXPANSION COEFFICIENT (ppm/deg-C) | 18 |
| GLASS TRANSITION TEMPERATURE (deg-C) | NA |
| THERMAL CONDUCTIVITY (W/mK, at 25 deg-C) | 0.31 |

| | UPPER FILM | | | |
|---|---|---|---|---|
| | SiO₂ (i) | SiO₂ (ii) | SiCN | SiCN (CMP) |
| SiOC | × | × | ○ | ○ |
| POLYPHENYLENE | × | NO DATA | ○ | ○ |
| L-Ox™ | ○ | NO DATA | ○ | ○ |
| POROUS L-Ox™ | ○ | NO DATA | ○ | ○ |
| SiO₂ | NO DATA | NO DATA | ○ | ○ |

FIG. 18B

| | LOWER FILM |
|---|---|
| | SiCN |
| SiOC | × |
| POLYPHENYLENE | × |
| L-Ox™ | ○ |
| POROUS L-Ox™ | ○ |
| SiO₂ | ○ |

SEMICONDUCTOR DEVICE INCLUDING LADDER-SHAPED SILOXANE HYDRIDE AND METHOD FOR MANUFACTURING SAME

This application is based on Japanese patent application NO. 2003-024281, the content of which is incorporated hereinto by reference.

BACKGROUND OF THE INVENTION

1. Field of the Invention

The present invention relates to a technology for improving an adhesiveness of an interlayer insulating film employing an insulating material having a lower dielectric constant.

2. Description of the Related Art

Needs for achieving faster operation of semiconductor devices are growing in recent years, and in order to meet the needs, investigations for reducing the interconnect capacitance are actively conducted by replacing the conventional material for interlayer insulating film of the silicon oxide film (dielectric constant K=about 4.3) to a new material having lower dielectric constant. The insulating materials having lower dielectric constant include hydrogen silsesquioxane (HSQ), methyl silsesquioxane (MSQ), organic resin materials containing aromatic compounds or the like, that have a dielectric constant of about 3, and more recently, the development of porous materials, which contains fine pores within the film for the purpose of decreasing the dielectric constant, is also investigated. Such materials having lower dielectric constant is employed for the interlayer insulating film to reduce the interconnect crosstalk, thereby achieving faster operation of the devices.

The films having lower dielectric constant generally have insufficient mechanical performances and/or plasma resistance. Thus, a protective film is often formed on the film having lower dielectric constant for the purpose of preventing damages during the processes for forming the interconnect or for depositing the insulating film.

However, the above layer constitution may cause insufficient adhesiveness between the insulating film having lower dielectric constant and the protective film.

JP-A-2001-326,222 discloses a technology of solving the insufficient adhesiveness of the insulating film having lower dielectric constant described above. FIG. 1 is a cross sectional view of an interconnect structure disclosed in JP-A-2001-326,222 as a prior art. The interconnect structure shown in the figure comprises an interlayer insulating film, which contains a silicon nitride film 1, a MSQ film 2 thereon and a silicon oxide film 4 thereon, and a copper interconnect containing a barrier metal film 5 and copper film 6, which is formed in the interlayer insulating film. Since the MSQ film 2 comprises an organic material and the silicon oxide film 4 comprises an inorganic material, the insufficient adhesion may occur between these films, and further the peeling off therebetween may be caused in the extreme cases. In order to address the problem, JP-A-2001-326,222 discloses a configuration of having a methylated hydrogen silsesquioxane (MHSQ) film 3 disposed between the MSQ film 2 and the silicon oxide film 4 as shown in FIG. 2, to improve the adhesiveness therebetween. According to the disclosure of JP-A-2001-326,222, although the MHSQ film 3 is employed in the embodiment shown in the figure, it is disclosed that other materials of polysiloxane compounds having Si—H group within their molecules may also be employed, and it is further described that the reason of improving the adhesiveness by employing these films comprising the above-mentioned materials may be considered that Si—H group is dehydrogenated to form activated reactive sites in the molecule, which, in turn, react with the upper and lower insulating films.

Nevertheless, the technology described in JP-A-2001-326,222 may have a room for further being improved in areas other than the improvement of the adhesiveness. First, the layer constitution shown in FIG. 1 may have a problem, in which it is easier to introduce moisture within the devices having such layer constitution. Although the reasons of occurring the problem is not necessarily clear, it may be considered that the surface of the MSQ film 2 is modified during the process of depositing the silicon oxide film 4 via chemical vapor deposition (CVD) to form a layer having a hygroscopic nature.

Further, the layer constitution shown in FIG. 2 may have an increased dielectric constant of the interlayer insulating film. Polysiloxane compounds having Si—H group within their molecules have a tendency to have increased dielectric constant when the compounds are exposed within plasma. It is considered that, in the layer constitution shown in FIG. 2, the surface of the film comprising polysiloxane compounds having Si—H group is modified during the deposition process of silicon oxide film 4 via CVD, thereby increasing the dielectric constant.

On the other hand, JP-A-H07-240,460 (1995) discloses a configuration, in which a silicon oxide film is deposited on a spin-on glass (SOG) film comprising hydrogen silsesquioxane via plasma CVD. It is further described that this configuration relaxes the stress in the interlayer insulating film including the SOG film, thereby inhibiting the generation of the cracks.

This configuration may also cause the increase of the dielectric constant of the interlayer insulating film. As described later, hydrogen silsesquioxane generally have a cage-shaped molecular structure as shown in FIG. 3, and there is a stronger tendency that hydrogen atom in the molecular structure is easily eliminated to increase the dielectric constant thereof. It is considered that, in the layer constitution described in JP-A-H07-240,460, the surface of the film comprising polysiloxane compounds is exposed within plasma during the deposition process of silicon oxide film, thereby increasing the dielectric constant.

Meanwhile, the method of inhibiting the deterioration of the performances due to introducing moisture within the interlayer insulating film generally employs a manner of providing a guard ring. Paragraphs 0002 and 0003 of JP-A-H10-199,883 (1998) and JP-A-2002-134,506 disclose semiconductor devices having guard rings provided therein. The guard ring in the semiconductor device is formed to surround a semiconductor chip or a specified pattern for the purpose of protecting the semiconductor chip or the specified pattern to inhibit the introduction of moisture into the semiconductor device, thereby stabilizing the operation of the semiconductor device. The introduction of moisture into the semiconductor device may cause an erosion of the metal interconnects or degrade the performances of the device by the uptake of moisture, thereby considerably deteriorating the reliability of the device. Thus, as described in the paragraph 0002 of JP-A-H10-199,883, the formation of the guard ring is an essential subject matter.

The guard ring can be provided by forming a bit line contact hole and filling the formed contact hole with a guard ring-forming material during the process of manufacturing the semiconductor device. Alternatively, in place of forming the bit line contact hole, the guard ring may also be provided by forming a node contact hole, a metal contact hole and a via contact hole that are formed therein, and thereafter filling the formed contact holes with a guard ring-forming material. Further, the guard ring may also be formed by additionally forming a dummy contact hole on the periphery of the above-mentioned contact holes, and thereafter filling the formed dummy contact holes with a guard ring-forming material. However, the configuration of providing the guard ring has reduced areas, on which devices are formed, and therefore the presence of the guard ring may be a factor of inhibiting the higher integration.

SUMMARY OF THE INVENTION

In view of the above situation, the present invention provides a solution to the above-mentioned problems, and it is an object of the present invention to reduce the effective dielectric constant of the insulating film while maintaining better reliability of the semiconductor device, which otherwise may be deteriorated by a moisture absorption.

According to the present invention, there is provided a semiconductor device comprising:

a semiconductor substrate; a first insulating film formed on an upper side of the semiconductor substrate, the first insulating film containing ladder-shaped siloxane hydride; and a second insulating film disposed adjacent to the first insulating film, the second insulating film containing oxygen as a constituent element.

Also, according to the present invention, there is provided a method for manufacturing a semiconductor device comprising: forming a first insulating film containing ladder-shaped siloxane hydride on a semiconductor substrate;

and forming a second insulating film adjacent to the first insulating film via a plasma CVD utilizing a source gas containing oxygen.

Concerning the film having lower dielectric constant such as MSQ or the like, which contains carbon, it is considered that, when an insulating film containing oxygen thereon, the film having lower dielectric constant may be damaged during the process for depositing thereof. Since the present invention employs ladder-shaped siloxane hydride, the deterioration of the film containing oxygen occurred during the deposition process is effectively inhibited to provide an improvement in the adhesiveness of the interlayer insulating film.

According to another aspect of the present invention, the second insulating film may further contain silicon as a constituent element. For example, the second insulating film may be a film comprising a compound selected from the group consisting of $SiO_2$, SiOC, SiON and SiOF. Such film may preferably be formed via plasma CVD utilizing a source gas containing oxygen and a silicon compound.

According to yet other aspect of the present invention, the semiconductor device may further comprise a metal interconnect embedded in a multilayer structure, the multilayer structure comprising the first insulating film and the second insulating film. According to further aspect of the present invention, the above-mentioned method for manufacturing the semiconductor device may further comprise: after forming the second insulating film, selectively removing the second insulating film and the first insulating film to form an interconnect groove; and filling the interconnect groove with a metal to form a metal interconnect. Further, semiconductor devices such as transistors may be formed on the semiconductor substrate. Since the interlayer insulating film having the ladder-shaped siloxane hydride according to the present invention can effectively inhibit the introduction of moisture, it is possible to have a configuration of free of a guard ring. That is, it is possible to improve the reliability of the semiconductor device while maintaining higher integration level of the semiconductor device.

BRIEF DESCRIPTION OF THE DRAWINGS

FIG. 5 is a table showing the physical properties of ladder-shaped siloxane hydride (L-Ox™).

FIGS. 18A and 18B are table showing the results of the pressure cooker test.

DESCRIPTION OF THE PREFERRED EMBODIMENTS

A first film according to the present invention contains ladder-shaped siloxane hydride. Ladder-shaped siloxane hydride is a polymer having a ladder-shaped molecular structure, and preferably has a dielectric constant of not higher than 2.9 in view of preventing the interconnect delay, and preferably has lower film density. For example, the polymer preferably has a film density within a range of from 1.50 g/cm$^3$ to 1.58 g/cm$^3$, and has a refraction index at a wavelength of 633 nm within a range of from 1.38 to 1.40. L-Ox™ or the like may be illustrated as a typical film material.

Figure 4:
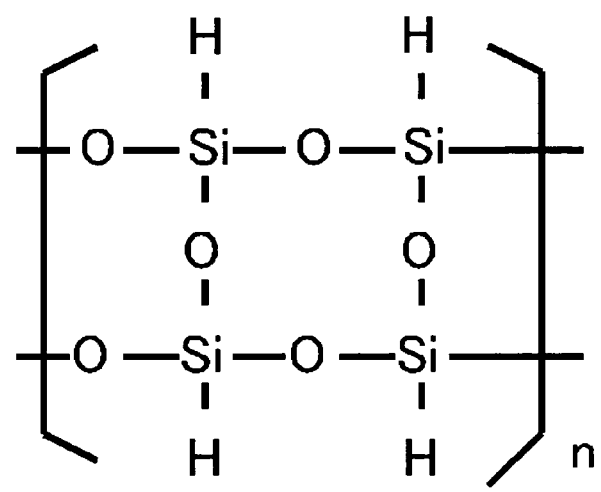
FIG. 4 is a chemical structure of L-Ox™ having ladder-shaped siloxane hydride structure.

FIG. 4 shows a chemical structure of the ladder-shaped siloxane hydride (L-Ox™), which has ladder-shaped siloxane hydride structure. The sign "n" appeared in the structure indicates a positive number of equal to or greater than 1. FIG. 5 shows physical properties of the ladder-shaped siloxane hydride (L-Ox™) having such chemical structure.

Figure 6:
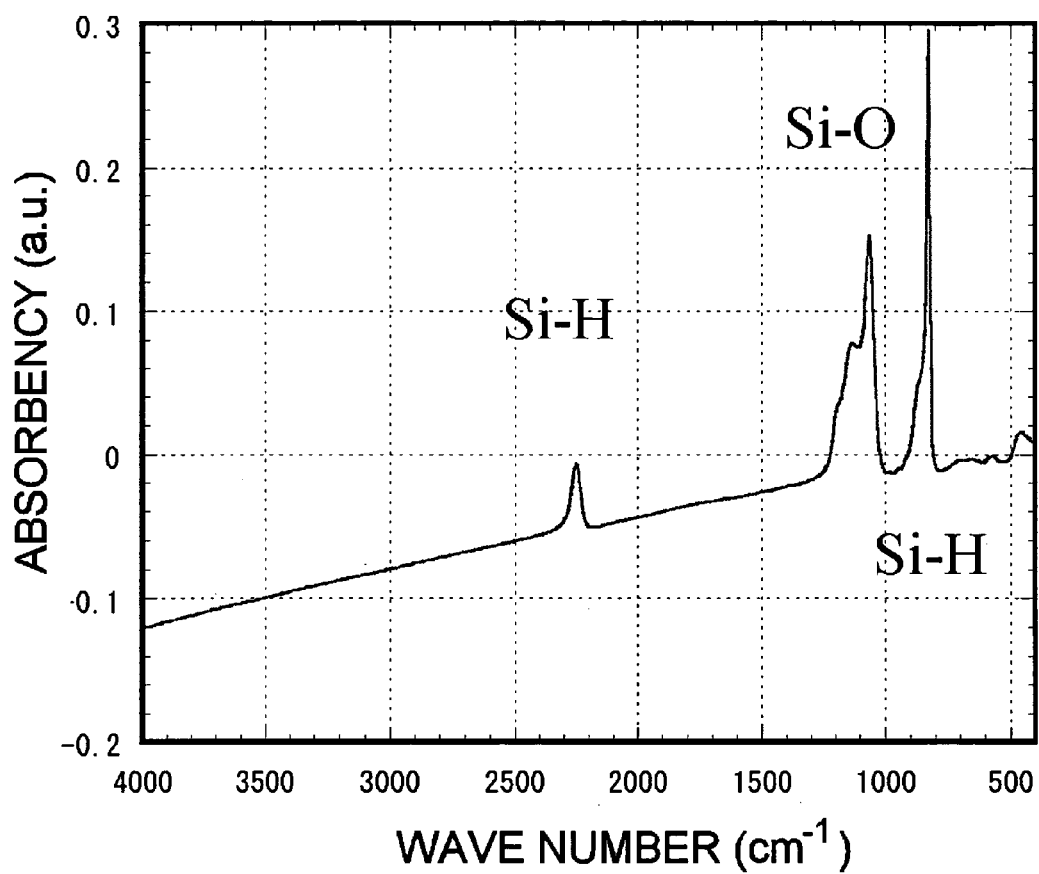
FIG. 6 is an IR spectrum of ladder-shaped siloxane hydride (L-Ox™).

It was confirmed by the results of the FT-IR measurement shown in FIG. 6 that the ladder-shaped siloxane hydride (L-Ox™) has the chemical structure shown in FIG. 4. The characteristic feature found in the chart of FIG. 6 is a sharp peak appeared at about 830 cm−1 indicating the presence of Si—H bond, and the rapid ascent of the peak suggests that the ladder-shaped siloxane hydride (L-Ox™) has a two-dimensional chemical structure. Also, an expected another peak indicating the presence of Si—H bond, which is expected to appear at a higher wave number side around approximately 870 cm−1, is extremely small, and thus this also indicates that the material to be measured has the two-dimensional chemical structure.

The physical properties of the ladder-shaped siloxane hydride (L-Ox™) are also variable depending on the baking temperature. This will be described on the basis of the disclosure of FIG. 7.

Figure 7:
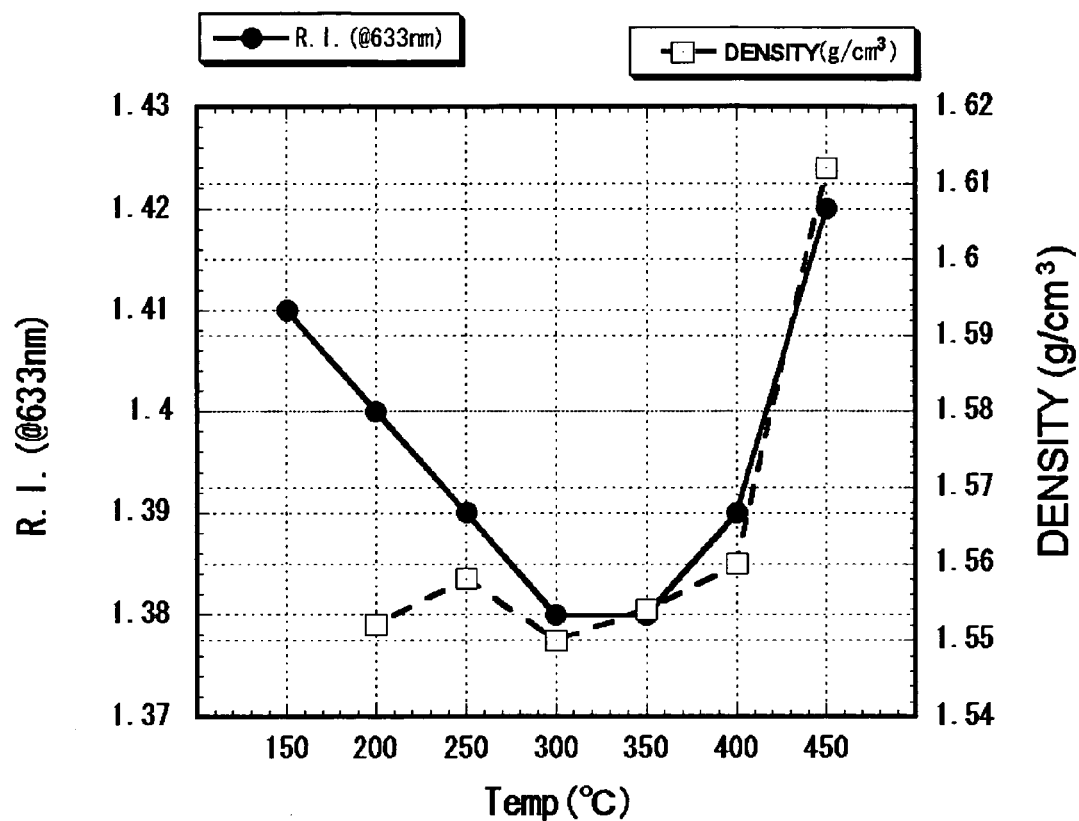
FIG. 7 is a graph showing the dependence of the refractive index and the density of the ladder-shaped siloxane hydride (L-Ox™) on the baking condition.

The ladder-shaped siloxane hydride (L-Ox™) formed by baking within the inert gas atmosphere such as nitrogen or the like at a temperature within a range of from 200 degree C. to 400 degree C. has the following properties. In FIG. 7, "R.I." indicates the refractive index at a wavelength of 633 nm. The refractive index is a parameter that directly has an influence on the dielectric constant, and the value thereof varies within a range of from 1.38 to 1.40. The values of the refractive indexes thereof at a temperature lower than 200 degree C. or at a temperature higher than 400 degree C. were higher than 1.40.

The densities of the ladder-shaped siloxane hydride (L-Ox™) formed by baking at a temperature from 200 degree C. to 400 degree C. were 1.50 g/cm3 to 1.58 g/cm3. The density of the film baked at a temperature higher than 400 degree C. was higher than 1.60 g/cm3. The density of the film baked at a temperature lower than 200 degree C. was not measurable.

When the film was formed by baking at a temperature lower than 200 degree C., a peak appeared at about 3,650 cm$^{-1}$, which is thought to indicate the presence of Si—OH (silanol) bonding, was observed in the FT-IR spectrum. The film baked at a temperature of higher than 400 degree C. exhibited a noticeable increase of the density.

The above results indicate that ladder-shaped siloxane hydride (L-Ox™) having better properties as well as having lower dielectric constant can be stably obtained by baking at an atmosphere temperature from 200 degree C. to 400 degree C. when the insulating film including the ladder-shaped siloxane hydride (L-Ox™) is deposited.

Figure 1:
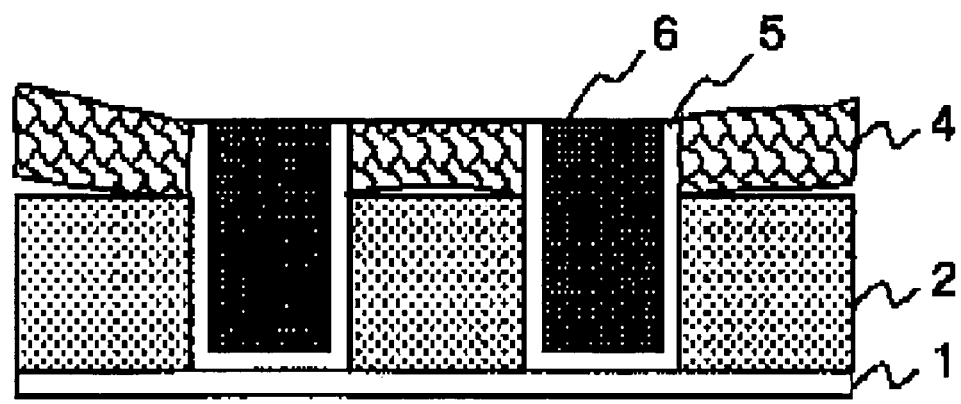
FIG. 1 is a cross sectional view of a conventional multilayer interconnect structure.
Figure 2:
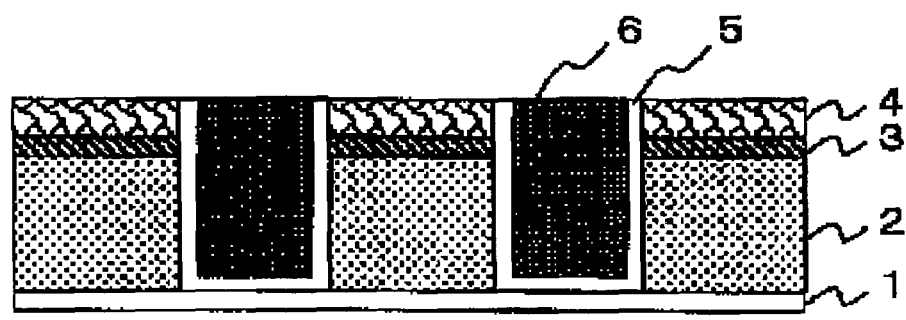
FIG. 2 is a cross sectional view of a conventional multilayer interconnect structure.
Figure 3:
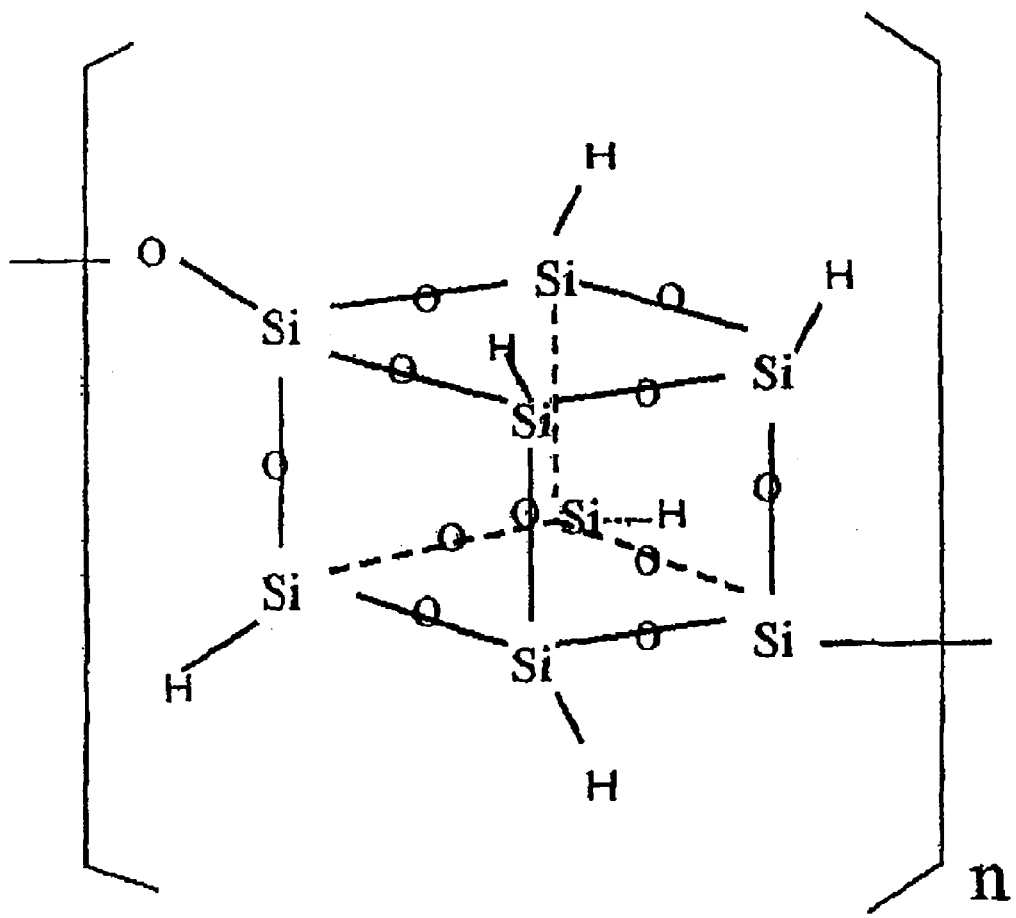
FIG. 3 is a chemical structure of molecular skeleton of HSQ.

FIG. 3 shows a molecular skeleton of conventionally known hydrogen silsesquioxane (HSQ) having siloxane hydride structure that is a three-dimensional chemical structure. (This is cited from "Semiconductor Technology Outlook", 1998, pp. 431–435.)

The two materials having the above described structures have considerably different film stabilities during the manufacturing processes, and the ladder-shaped siloxane hydride (L-Ox™) exhibits markedly superior film stability to HSQ. It is considered that this is because the decrease of Si—H content in ladder-shaped siloxane hydride (L-Ox™) during the manufacturing process is lower than that in HSQ. It is also considered that the difference in the manner of forming bonds with hydrogen atoms is also a reason thereof. More specifically, in HSQ, hydrogen atom is bonded thereto at a corner of the cubic structure, and meanwhile in ladder-shaped siloxane hydride (L-Ox™), hydrogen atom is bonded thereto at a portion of the side of the ladder structure. Therefore, the density around hydrogen atoms of HSQ is lower than that of ladder-shaped siloxane hydride (L-Ox™), and thus it is considered that hydrogen bond included in HSQ is more reactive than hydrogen bond included in ladder-shaped siloxane hydride (L-Ox™) for the structural reason.

Figure 8A:
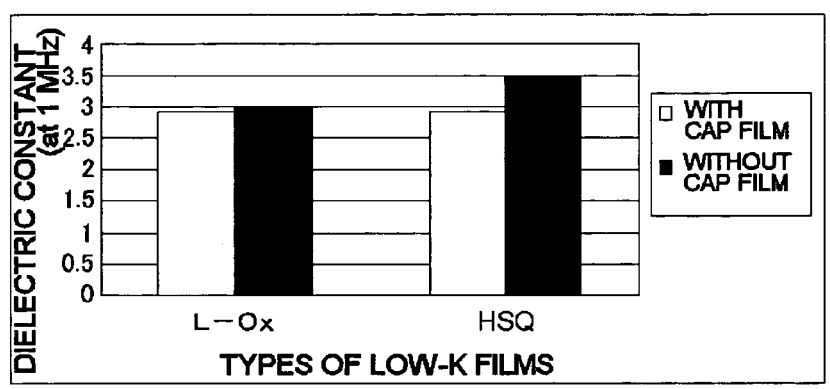
FIG. 8A is a histogram showing the results of the measurement of the dielectric constant.
Figure 8B:
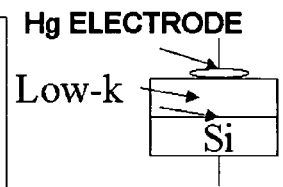
FIGS. 8B and 8C are schematic diagram of the layer structure of the samples for evaluating the dielectric constant of HSQ and ladder-shaped siloxane hydride (L-Ox™).
Figure 8C:
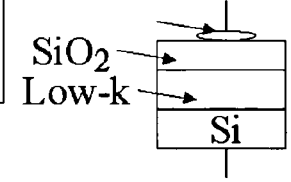

Next, first samples that are provided with a film having lower dielectric constant on a silicon substrate, and another samples that are further provided with a cap film of SiO2 film on the first samples, were manufactured, and the results of the measurements of the dielectric constants thereof are shown in FIG. 8A. Two types of the films having lower dielectric constant, that are ladder-shaped siloxane hydride (L-Ox™) and HSQ (hydrogen silsesquioxane), were employed. The layer structures of the samples are shown in FIGS. 8B and 8C. The thicknesses of the layers in the samples are as follows:

films having lower dielectric constant (indicated as "low-k" in FIGS. 8B and 8C) 0.3 μm; and SiO$_2$ film 0.1 μm.

Comparison of the dielectric constants of the low-k film alone with the cap film and without the cap film were conducted, and it was found that the dielectric constant of HSQ was changed from 2.9 for having no cap layer to 3.5 for having the cap layer, and on the contrary, the dielectric constant of the ladder-shaped siloxane hydride (L-Ox™) was not considerably changed, regardless of the presence of the cap layer.

Porous ladder-shaped siloxane hydride film may be employed as the ladder-shaped siloxane hydride film in the present invention for further reducing the dielectric constant. Porous ladder-shaped siloxane hydride can be formed via template method. Porogen comprising organic polymers is dissolved with a solution of the ladder-shaped siloxane hydride, and the solution is baked at about 200 degree C. to form siloxane hydride skeleton, and further, is baked at about 300 degree C. to decompose the organic polymers, and is baked at about 350 degree C. to sufficiently carry out the baking process, and the pores are formed thereon to form the porous film. This is the porous ladder-shaped siloxane hydride film, and the relative dielectric constant of about 2.2 can be achieved at lowest for the present time, depending on the quantity of the introduced porogen. In consideration for the process stability for the formation of the film, the film having the dielectric constant K=about 2.4 to about 2.6 is the optimal, and such film is referred to as porous L-Ox™ here.

Although the FT-IR spectrum of the porous L-Ox™ has a spectrum shape that is identical to that of the L-Ox™, the film strength of the porous L-Ox™ decreases as the film density decreases.

Similarly as the above described comparisons, comparisons of the dielectric constant of the low-k films of the first samples comprising a film having lower dielectric constant on a silicon substrate with that of another samples further comprising a cap film of SiO$_2$ film on the first samples, were conducted in the condition, in which the low-k film was the porous L-Ox™ film having k of 2.4, and the results were that the dielectric constant of the low-k film alone with having no cap layer was 2.4, and the dielectric cons tant of the low-k film alone for having the cap layer was 2.5, and thus it was found that the dielectric constant thereof were not considerably increased.

Next, the preferable embodiments according to the present invention will be described in reference to the annexed figures.

First Embodiment

FIGS. 9A to 9D are the cross sectional views showing the processing steps of the process for forming the semiconductor device according to the first preferred embodiment of the present invention.

Figure 9A:
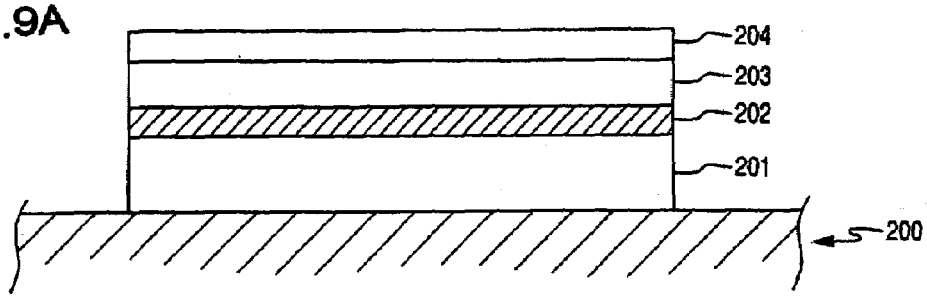
FIGS. 9A to 9D are cross sectional views of the semiconductor devices, showing the processing steps of the process for forming the copper interconnect according to the preferred embodiment of the present invention.

In the method for manufacturing the semiconductor device according to the present embodiment, an underlying insulating film 201 is disposed on a substrate 200 having a semiconductor device formed thereon, and a SiCN film 202, which will be an etch stop film at the stage of forming an interconnect groove, is deposited via plasma CVD thereon to a thickness of 50 nm. Then, a L-Ox™ film 203 is formed by an applying method to a thickness of 300 nm, and the baking processing is carried out within N2 atmosphere at 400 degree C. for 30 minutes. Subsequently, a $SiO_2$ film 204 is deposited to a thickness of 100 nm (FIG. 9A). The deposition process of the $SiO_2$ film 204 is carried out by employing a source gas containing $SiH_4$ and $N_2O$, and the volumetric flow rates of $SiH_4$ and $N_2O$ are set to 200 to 300 sccm and 3,500 to 4,000 sccm, respectively.

Figure 9B:
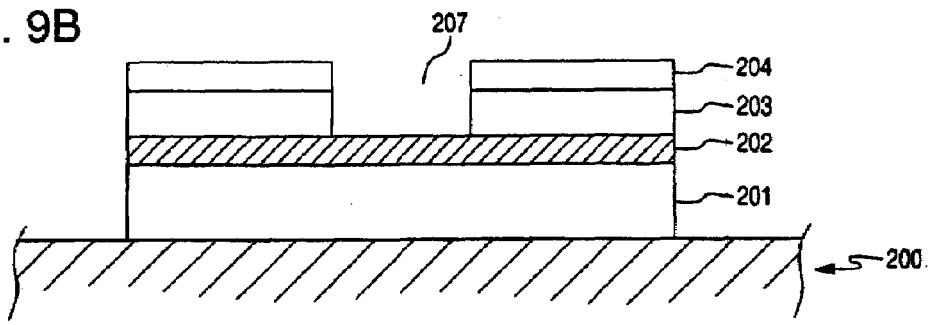

Thereafter, the $SiO_2$ film 204 and the L-Ox™ film 203 are selectively dry-etched via a resist mask that is not shown to form an interconnect groove 207 (FIG. 9B).

Figure 9C:
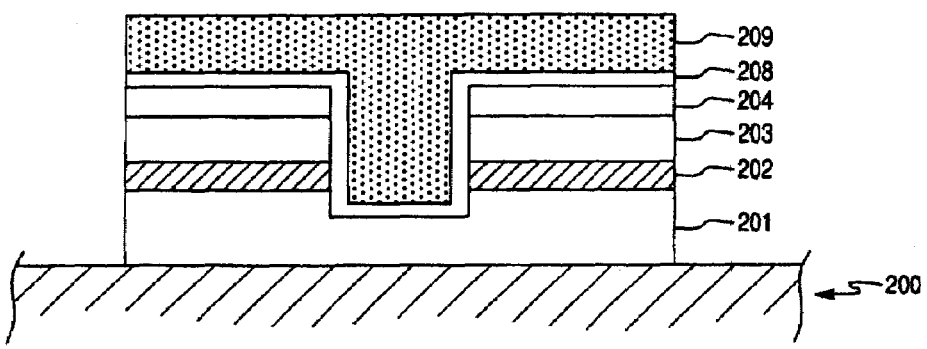

Next, an etch back process is carried out on the entire surface thereof to remove SiCN. Thereafter, a barrier metal of Ta/TaN films 208 (dual-layer films having an upper layer of Ta and a lower layer of TaN; hereinafter referred to as same) is deposited to a thickness of 30 nm via sputtering, and thereafter Cu film, which will be a seed layer, is deposited thereon via sputtering. After that, the interconnect groove 207 is filled with Cu via electrolytic plating to further form a Cu film 209 (FIG. 9C). The Cu film 209 is annealed within $N_2$ atmosphere at 400 degree C. for 30 minutes to crystallize thereof. Then, the Cu film 209, which is disposed on the $SiO_2$ film 204, and the Ta/TaN films 208 are removed via chemical mechanical polishing (CMP) to remove copper disposed outside the interconnect groove 207. The CMP process is carried out until the surface of the $SiO_2$ film 204 is exposed. Here, the copper interconnect is formed (FIG. 9D).

Figure 9D:
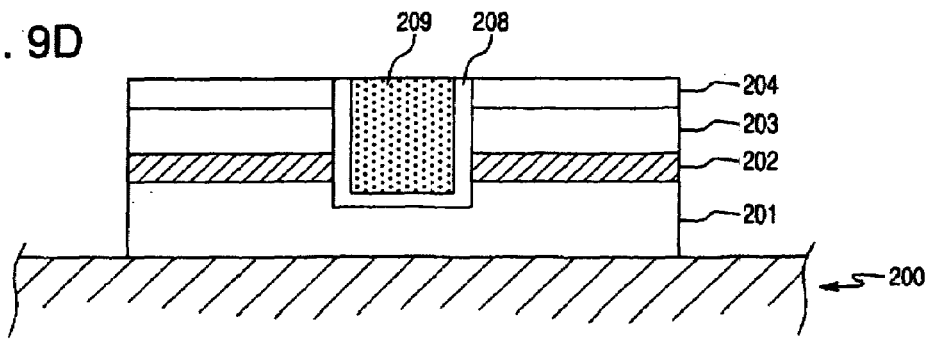

After obtaining the copper interconnect shown in FIG. 9D, an interlayer insulating film may further be formed to provide a multilayer interconnect structure. Although the annexed figures show just the cross sections of the single copper interconnect, a plurality of interconnects may be simultaneously formed in other areas.

In the copper interconnect structure obtainable in the present embodiment, interconnect insulating films formed in the layers including the copper interconnect are formed of the L-Ox™ film 203 and the $SiO_2$ film 204. The L-Ox™ film 203 stably exhibits its dielectric constant of about 2.9.

Thus, the crosstalk between the copper interconnect, which is shown in figures, and other copper interconnects, which are adjacent to the shown copper interconnect and not shown in the figures, is effectively inhibited. Further, as described before, since L-Ox™ contains the ladder-shaped siloxane hydride structure, the thickness and the physical performances of the formed film are stable, and thus the change in the performances of the formed film during the manufacturing process of the device is scarcely occurred. Therefore, the devices can be manufactured as originally designed with better manufacturing stability, according to the present embodiment. Meanwhile, the $SiO_2$ film 204 has better resistance to the CMP process or the like than the L-Ox™ film 203, and thus the $SiO_2$ film 204 functions as a protective film. More specifically, the $SiO_2$ film 204 functions inhibiting the damage occurred in the, interconnect insulating films during the CMP processing in the process of manufacturing the copper interconnect. Further, the adhesiveness between the L-Ox™ film 203 and the $SiO_2$ film 204 is sufficiently good, so that the introduction of water therein is fully prevented. As described above, the configuration provided by the present embodiment presents the interconnect structure having higher performances and higher reliability.

Second Embodiment

Figure 10:
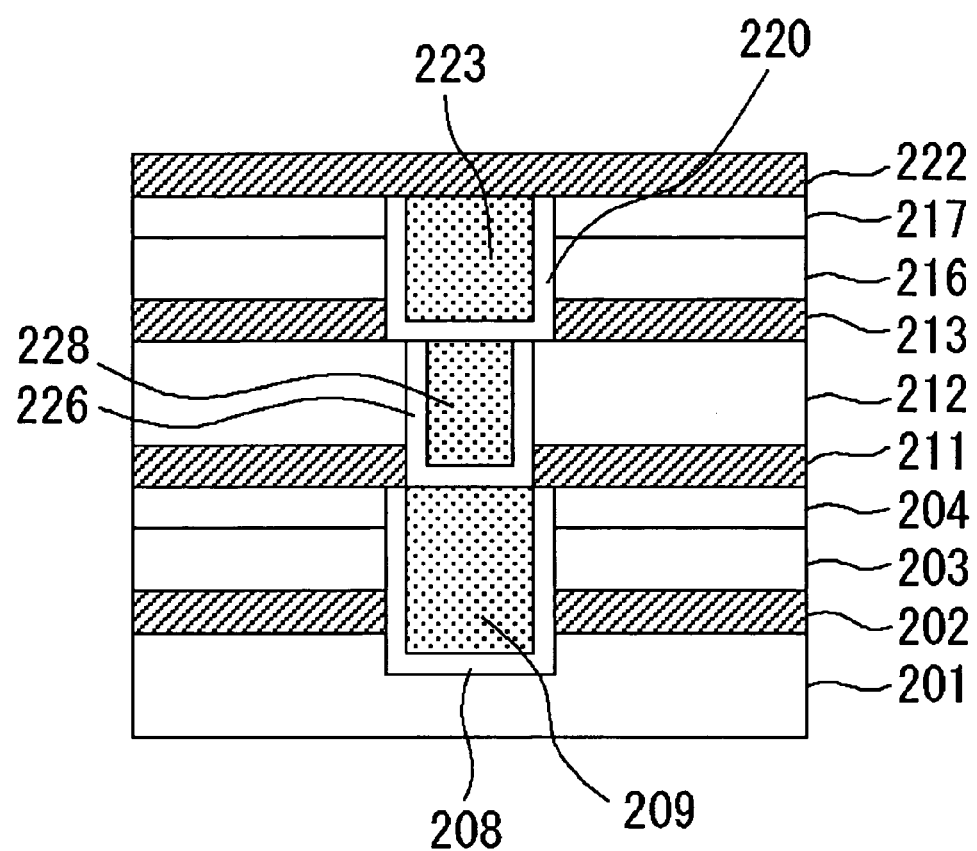
FIG. 10 is a cross sectional view of the semiconductor device according to the preferred embodiment of the present invention.

The present embodiment shows an embodiment, in which the present invention is applied to a dual-layer copper interconnect having a single damascene structure. FIG. 10 is a cross sectional view of structure of a semiconductor device according to the present embodiment. The semiconductor device according to the present embodiment has a configuration, in which a lower interconnect comprising a Cu film 209 is coupled to an upper interconnect comprising a Cu film 223 through a copper plug 228.

The lower interconnect comprising the Cu film 209 is formed in a multilayer films that include an underlying insulating film 201, a SiCN film 202, a L-Ox™ film 203 and a $SiO_2$ film 204. Side surfaces and a bottom surface of the Cu film 209 are covered by Ta/TaN films 208.

The copper plug 228 is provided in a hole formed in multilayer films comprising a SiCN film 211 and a $SiO_2$ film 212, and side surfaces and a bottom surface thereof are covered by Ta/TaN films 226.

The upper interconnect comprising the Cu film 223 is formed in multilayer films comprising a SiCN film 213, a L-Ox™ film 216 and a $SiO_2$ film 217. Side surfaces and a bottom surface of the Cu film 223 are covered by Ta/TaN films 220, and a SiCN film 222 is formed to cover an upper surface there of.

Figure 11A:
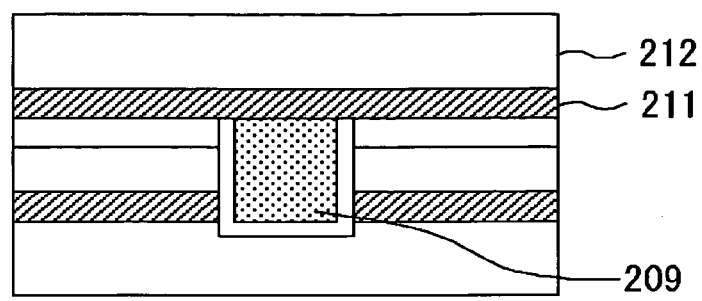
FIGS. 11A to 11D are cross sectional views of the semiconductor devices, showing the processing steps of the process for forming the copper interconnect according to the preferred embodiment of the present invention.

Next, the method for manufacturing the semiconductor device according to the present embodiment will be described. FIGS. 11A to 11D, 12E to 12G, 13H and 13I and 14J and 14K are cross sectional views of a semiconductor device, showing the processing steps for manufacturing the semiconductor device according to the preferred embodiment. In the present embodiment, a L-Ox™ film and a $SiO_2$ film disposed thereon are formed by the process conditions similar to those employed in the first embodiment. In the present embodiment, a lower interconnect comprising a Cu film 209 is, first, formed similarly as in the first embodiment. Next, a SiCN film 211 and a $SiO_2$ film 212 are deposited in sequence (FIG. 11A).

Figure 11B:
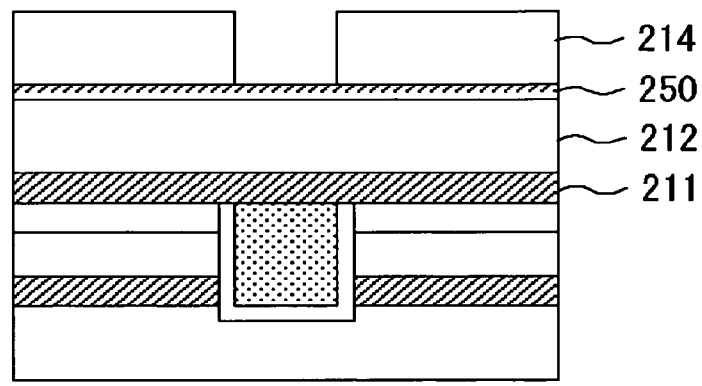

Subsequently, an anti-reflective film 250 and a photo resist 214 are applied on the $SiO_2$ film 212, and an aperture is formed in the photo resist 214 via a photolithography technology (FIG. 11B).

Figure 11C:
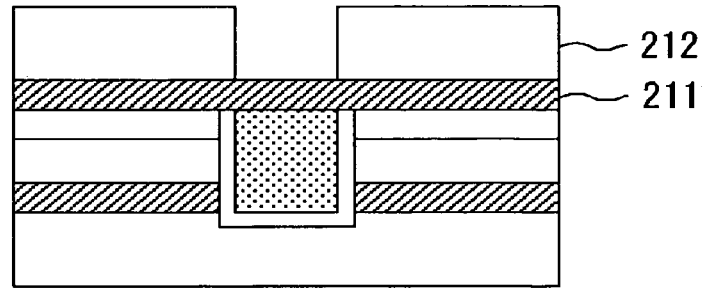

The $SiO_2$ film 212 is etched through the photo resist 214 to form a via pattern. Thereafter, ashing process is carried out to remove the photo resist 214 and the anti-reflective film 250 (FIG. 11C).

Figure 11D:
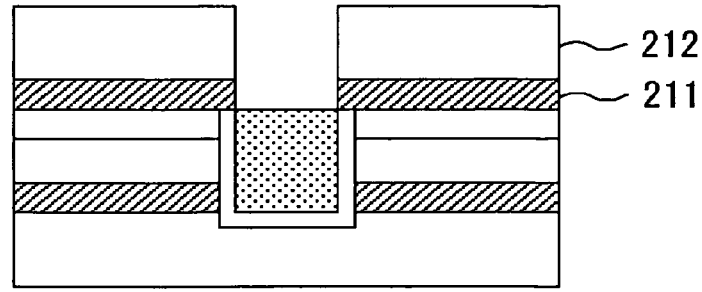

Next, the SiCN film 211 disposed on the bottom of the via is etched back, and the etch residue is stripped with a stripping solution (FIG. 11D).

Figure 12E:
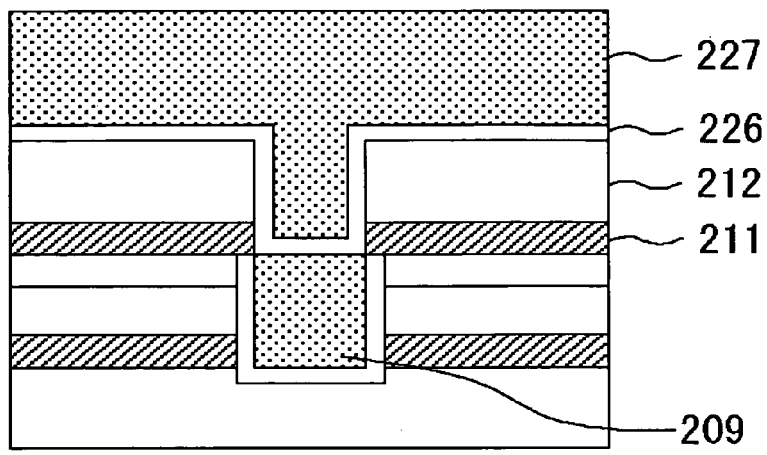
FIGS. 12E to 12G are cross sectional views of the semiconductor devices, showing the processing steps of the process for forming the copper interconnect according to the preferred embodiment of the present invention.

Thereafter, a Ta/TaN films 226 having a thickness of 30 nm is deposited via sputtering process, and a Cu film (not shown) for a seed is formed thereon, and after that, a Cu film 227 is formed to a thickness of 700 nm via electrolytic plating process to fill the via pattern therewith. Thereafter, a thermal processing is carried out at 400 degree C. for the crystallization (FIG. 12E).

Figure 12F:
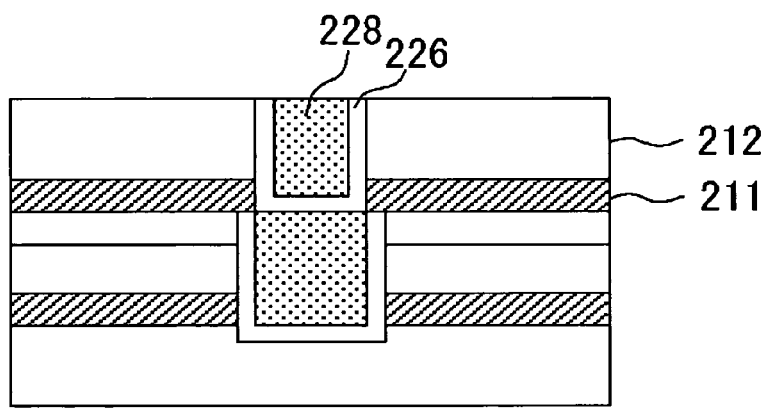

Next, the Cu film 227 and the Ta/TaN films 226 on the $SiO_2$ film 212 are removed by CMP process, and a copper plug 228 is formed therein (FIG. 12F).

Figure 12G:
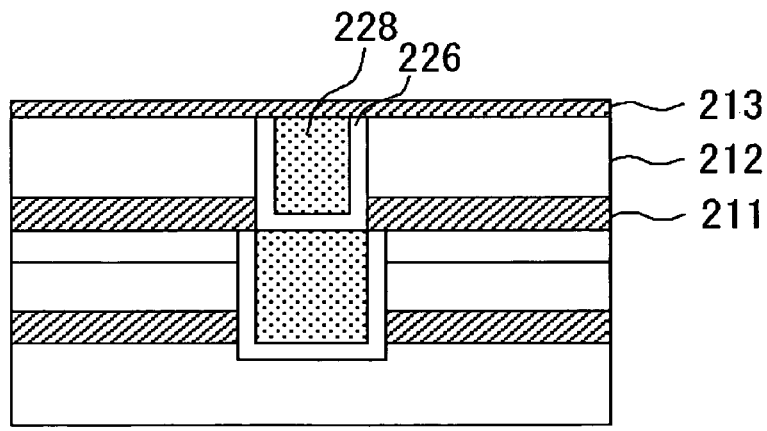

Next, a SiCN film 213, which will be a barrier film for Cu-diffusion, is formed on the copper plug 228 to a thickness of 50 nm (FIG. 12G).

Subsequently, a L-Ox™ film 216 is applied and baked to a thickness of 300 nm, and then a $SiO_2$ film 217 is deposited thereon to a thickness of 100 nm.

Figure 13H:
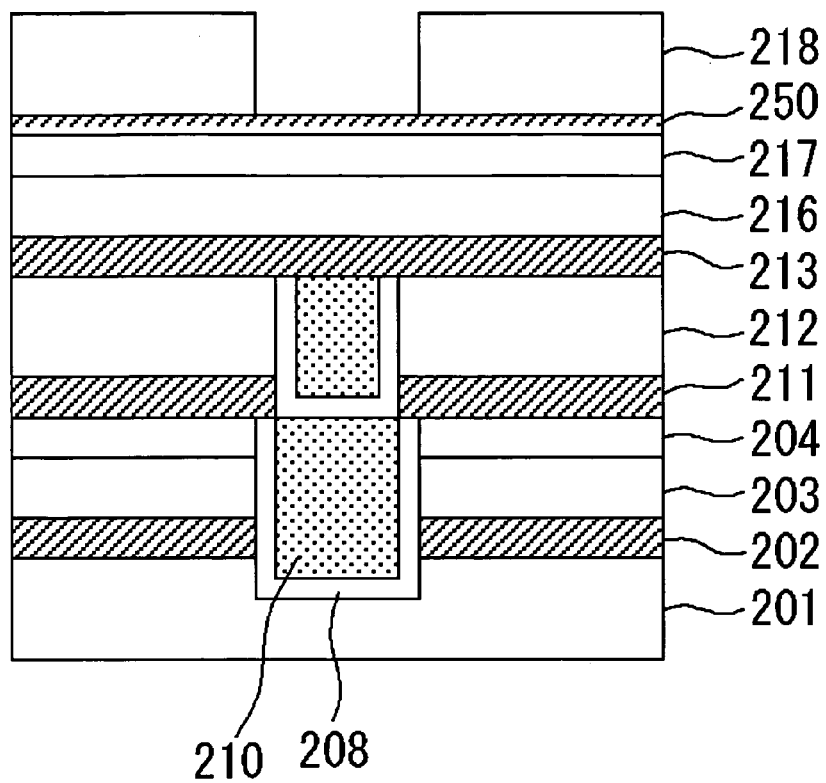
FIGS. 13H and 13I are cross sectional views of the semiconductor devices, showing the processing steps of the process for forming the copper interconnect according to the preferred embodiment of the present invention.
Figure 13I:
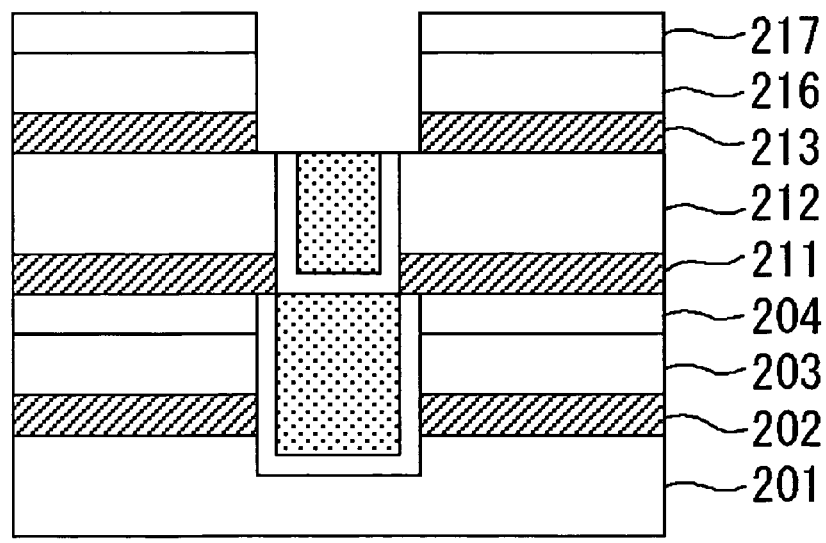

Next, an anti-reflective film 250 and a photo resist 218 are applied thereon, and an aperture is formed in the photo resist 218 via a photolithography technology (FIG. 13H). The $SiO_2$ film 217 and the L-Ox™ film 216 are etched via the mask of the photo resist 218, and then ashing process is carried out to remove the photo resist 218 and the anti-reflective film 250. Subsequently, the SiCN film 213 disposed on the bottom of the interconnect groove is etched back, and thereafter the etch residue is stripped with a stripping solution (FIG. 13I).

Figure 14J:
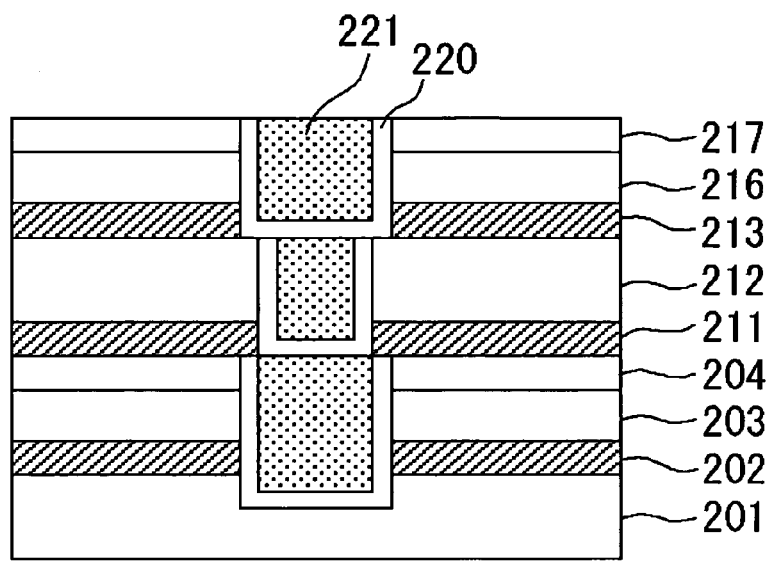
FIGS. 14J and 14K are cross sectional views of the semiconductor devices, showing the processing steps of the process for forming the copper interconnect according to the preferred embodiment of the present invention.

Thereafter, Ta/TaN films 220 are deposited to a thickness of 30 nm via sputtering process, and a Cu film (not shown) for a seed is formed on the Ta/TaN films 220 to a thickness of 100 nm. Thereafter, a Cu film 221 is formed thereon to a thickness of 700 nm via electrolytic plating process, and after that, CMP processing is conducted until the surface of the $SiO_2$ film 217 is exposed. Here, the upper interconnect is formed (FIG. 14J).

Figure 14K:
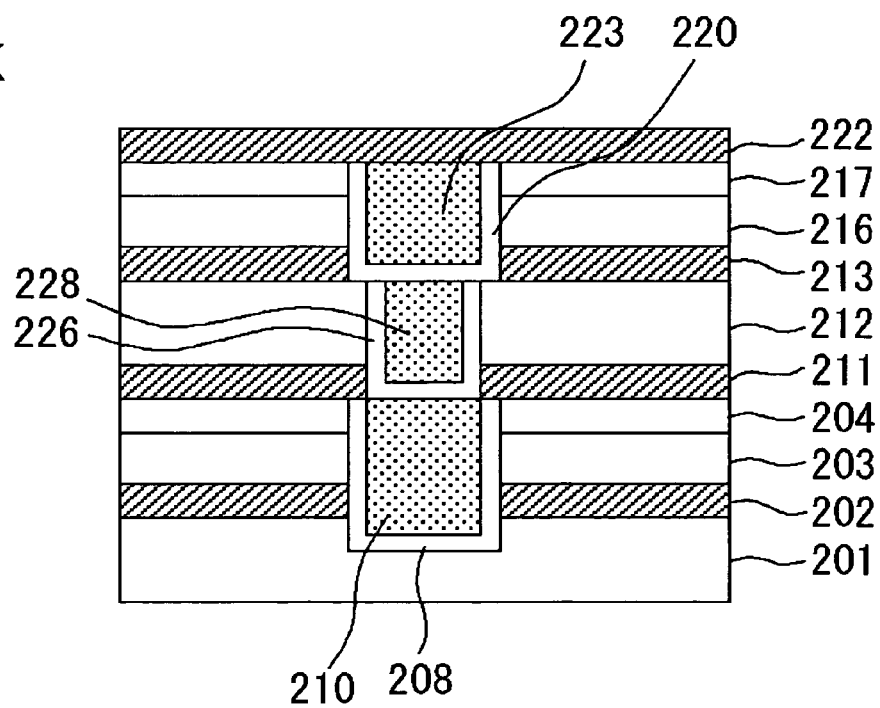

Next, a Cu-diffusion barrier film of a SiCN film 222 is formed thereon to a film thickness of 50 nm (FIG. 14K).

In the present embodiment, the interlayer insulating film is formed of the L-Ox™ film and the $SiO_2$ film. The L-Ox™ film stably exhibits its dielectric constant of about 2.9. Thus, the crosstalk between the copper interconnect, which is shown in figures, and other copper interconnects, which are adjacent to the shown copper interconnect and not shown in the figures, is effectively inhibited. Further, as described before, since L-Ox™ contains the ladder-shaped siloxane hydride structure, the thickness and the physical performances of the formed film are stable, and thus the change in the performances of the formed film during the manufacturing process of the device is scarcely occurred. Therefore, the devices can be manufactured as originally designed with better manufacturing stability, according to the present embodiment. Meanwhile, the $SiO_2$ film has better resistance to the CMP process or the like than the L-Ox™ film, and thus the $SiO_2$ film functions as a protective film. More specifically, the $SiO_2$ films (204, 217) function inhibiting the damage occurred in the interconnect insulating films during the CMP processing in the process of manufacturing the copper interconnect. Further, the adhesiveness between the L-Ox™ film and the $SiO_2$ film is sufficiently good, so that the introduction of water therein is fully prevented. As described above, the configuration provided by the present embodiment presents the interconnect structure having higher performances and higher reliability.

Although the present invention is described with respect to the preferred embodiments, it should be understood that the disclosures contained herein are for the illustration only, and optionally the configuration and/or the process thereof may be partially substituted with other configuration and/or process.

For example, although the copper interconnect is employed in the above described preferred embodiments, the interconnect line may also be a copper alloy interconnect, which is formed of an alloy of copper with at least one different element selected from the group consisting of: Al (aluminum); Ag (silver); W (tungsten); Mg (magnesium); Be (beryllium); Zn (zinc); Pc (palladium); Cd (cadmium); Au (gold); Hg (mercury); Pt (platinum); Zr (zirconium); Ti (titanium); Sn (tin); Ni (nickel); Nd (neodymium); and Fe (iron).

Although the Ta/TaN films are employed for the barrier metal in the above disclosures, the present invention may have a configuration, in which the barrier metal comprises at least one selected from the group consisting of: Ti; TiN; TiSiN; Ta; TaN; and TaSiN.

EXAMPLES

Example 1

Figure 15:
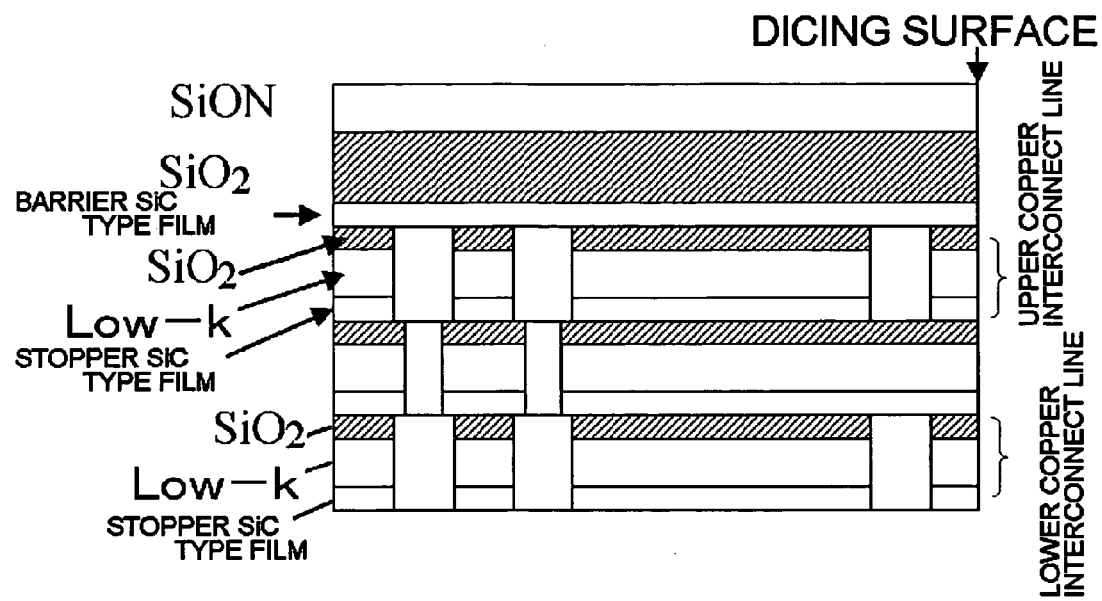
FIG. 15 is a cross sectional view of the semiconductor device, which was evaluated in the example.

In the present example, the moisture-absorption of an interconnect structure comprising a L-Ox™ film and a SiOC film, which form an interlayer insulating film, were examined by the pressure cooker test (PCT). The structure of the sample to be examined is shown in FIG. 15. The sample comprises a Cu single damascene structure including a low-k film, in which a lower copper interconnect is coupled to an upper copper interconnect through a via plug of Cu. A silicon substrate was employed for the substrate, and SiC-type films were employed for an etch stop film and a barrier insulating film. Further, a dual-layer structure of $SiON/SiO_2$ (having an upper layer of SiON and a lower layer of $SiO_2$) was employed for a cover film. Since the cover film was provided thereto, introduction of water from the top surface of the interconnect structure was inhibited.

The low-k films were employed for both the interconnect portion and the via portion of the interlayer insulating film. The employed low-k films were two levels of: (i) L-Ox™ film that is an applied film of an inorganic siloxane material; and (ii) CVD-SiOC film that is deposited by utilizing a parallel plate plasma CVD apparatus, and three samples were prepared for each of these two materials. A $SiO_2$ film deposited by using a parallel-plate CVD apparatus with $SiH_4$ and $N_2O$ gases was employed for hard masks disposed on the low-k film. The samples were the dicing-processed samples for the accelerated tests.

Three samples were prepared for each of the above-mentioned two materials, the measurements were conducted before and after the PCT (125 degree C., 100% humidity, 96 hrs. and 2 atoms), and changes in the interconnect capacitance after the PCT were measured. Here, the "interconnect capacitance" means a capacitance between each of interconnects that are disposed in a same layer, and in the present example, the measurements of the capacitance were carried out for the interconnects that were disposed in the same layer with the interconnect space distance between the upper interconnects of 0.14 μm.

Figure 16:
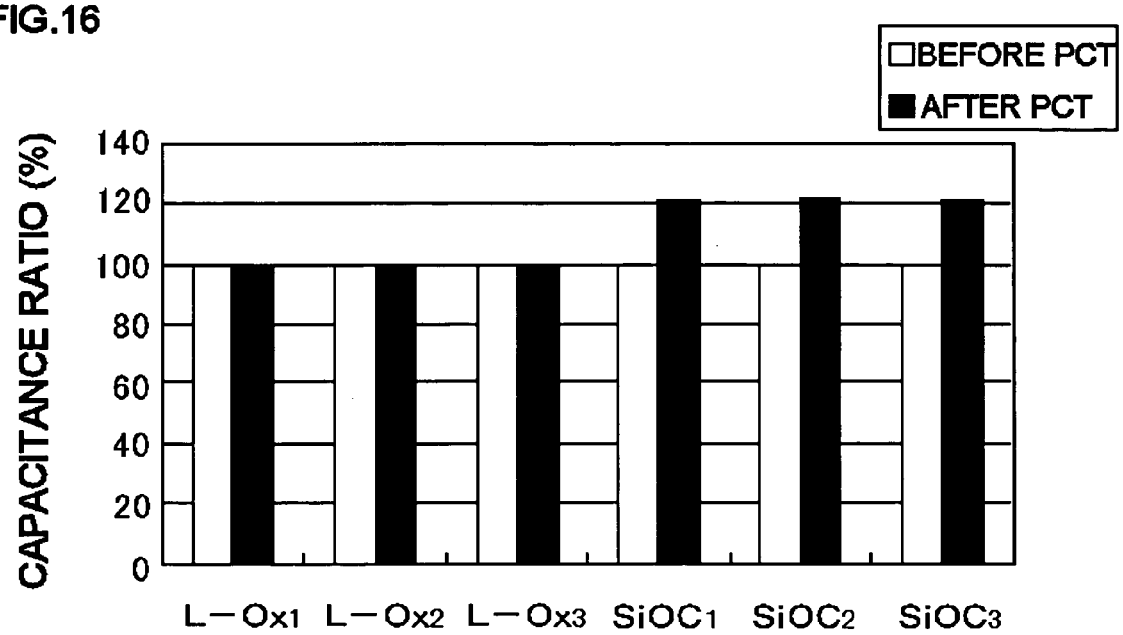
FIG. 16 is a histogram showing the results of the pressure cooker test.

FIG. 16 shows data of the capacitance ratio measured after the PCT, presenting data as reduced values provided that the value before the PCT is assumed 100%. For the samples employing L-Ox™, the values of before and after the PCT were not substantially different, and for the samples employing SiOC, the measured capacitance ratios of all three samples were increased after the PCT by about 20%. Thus, it is considered that the moisture absorption was already occurred in the inside of the chip within 96 hrs.

Figure 17:
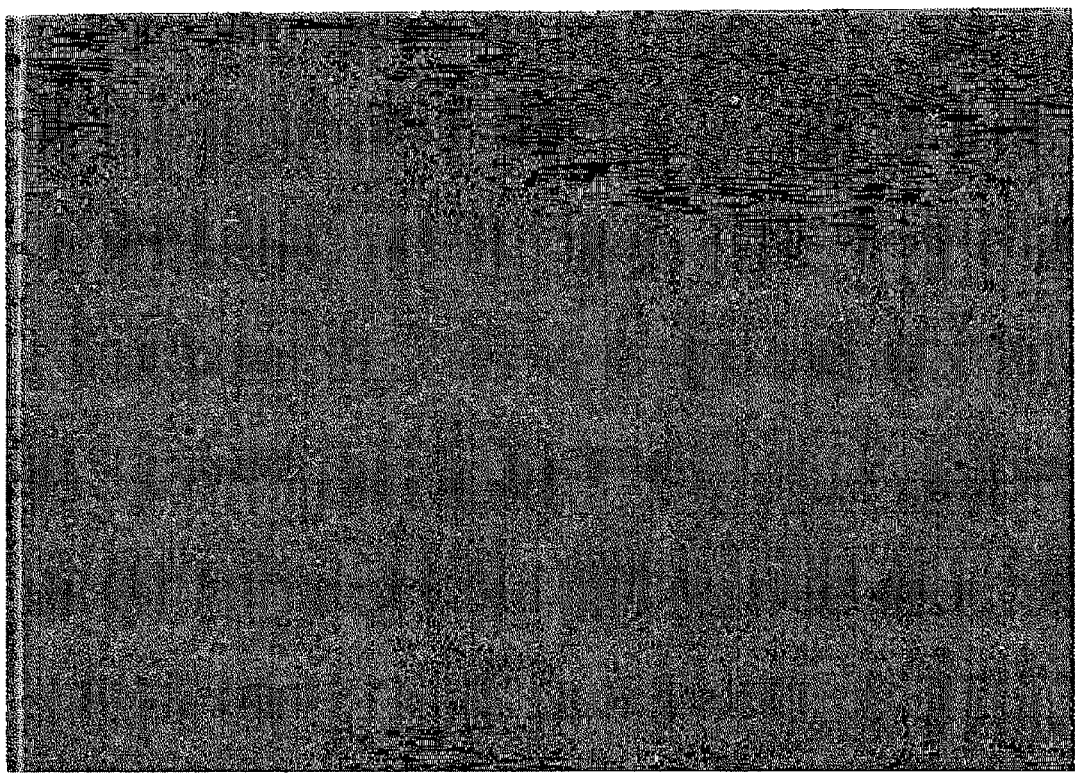
FIG. 17 is an optical microscopy image of the film, showing the blister occurred on the surface of the film after conducting the pressure cooker test.

The visual observation of the appearance of the sample employing SiOC was conducted after the PCT by utilizing an optical microscope, and some defects in the appearance thereof, which looked like bubbles, were observed. The appearance thereof is shown in FIG. 17. It is considered that the bubbles were generated by the introduction of water, and that water was introduced to the inside of the chip of the sample employing SiOC. On the other hand, no defect on the appearance was observed for the samples employing L-Ox™.

Example 2

In the present example, multilayer films were provided on a silicon substrate by employing various insulating film materials, and the water absorption thereof was evaluated by the PCT. The structure of the samples comprises two types of insulating films disposed on a silicon substrate and a cover film comprising SiON/SiO$_2$ (having an upper layer of SiON and a lower layer of SiO$_2$) disposed thereon. SiO$_2$ film was deposited by utilizing a parallel-plate CVD apparatus with SiH$_4$ and N$_2$O gases.

The structures of the two types of the insulating films were as shown in FIGS. 18A and 18B. In FIG. 18A, "SiO$_2$ (i)" indicates a silicon oxide film deposited by a plasma CVD, and "SiO$_2$ (ii)" indicates a silicon oxide film deposited by a plasma CVD after conducting He plasma processing. "SiCN(CMP)" indicates a SiCN film deposited after conducting metal CMP processing for the insulating film that is the layer underlying thereof.

For example, when SiOC is selected and SiO$_2$ is also selected for the upper layer film according to FIG. 18A, the selected layer structure of the sample is, in an order from upper toward lower (i.e., toward the substrate side): SiON/SiO$_2$/SiO$_2$ (i)/SiOC/silicon substrate. When SiOC is selected in FIG. 18B, the layer structure of the sample is: SiON/SiO$_2$/SiOC/SiCN/silicon substrate.

The results of the evaluations indicate that, when SiOC or polyphenylene was employed, the result of the PCT was not good in the cases of providing the SiO$_2$ film on the top of SiOC or polyphenylene (FIG. 18A). It is considered that this is because the upper surface of SiOC or polyphenylene was exposed to oxygen plasma when SiO$_2$ film was deposited on the top of SiOC or polyphenylene, and organic components thereof were decomposed to form a surface layer that had a hygroscopic nature. It was also found that, when SiCN layer was provided for the lower layer and SiOC or polyphenylene was disposed thereon, the result of the PCT characteristics was not also good. It is considered that this is because the SiO$_2$ of the lower layer of the cover film is adjacent to SiOC or polyphenylene and namely SiOC or polyphenylene was exposed to oxygen plasma when the upper layer of SiO$_2$ was deposited.

On the contrary, when L-Ox™ was employed, better PCT characteristics were obtained regardless of the types of upper layer film and/or lower layer film. It is considered that, since L-Ox™ has a unique molecular structure, L-Ox™ film itself exhibits better film quality as well as better adhesiveness with other films and better plasma resistance, and thus the better results were obtained.

Further, "porous L-Ox™" (k=2.4)" appeared in the table, which indicates porous L-Ox™ having a dielectric constant of 2.4, provided better PCT characteristics regardless of the types of upper layer film and/or lower layer film. In addition to the aforementioned better adhesiveness and the plasma resistance, L-Ox™ and porous L-Ox™ themselves exhibit better film quality, because L-Ox™ and porous L-Ox™ contain no organic component.

Although better PCT characteristics were obtained for the structure having SiO$_2$ film thereon, the structure may cause a problem in a practical use since the structure has an increased dielectric constant in the interlayer insulating film.

Although the illustrated examples are related to SiO$_2$, similar results may be obtainable when SiOC (precise formulation is SiOCH), SiON (precise formulation is SiONH) or SiOF, all of which contain oxygen, are employed.

Although the illustrated examples are also related to cases for employing N$_2$O gas as an oxidizing gas contained in the SiO$_2$ deposition gaseous mixture, other oxygen-containing gases such as O$_2$, NO, CO, CO$_2$, H$_2$O, tetraethoxysilane (TEOS) or dimethyldimethoxysilane may be employed.

Although the illustrated examples are also related to cases for employing SiH$_4$ gas as a silicon compound contained in the SiO$_2$ deposition gaseous mixture, other compounds such as monomethylsilane, dimethylsilane, trimethylsilane, tetramethylsilane, tetraethoxysilane (TEOS) dimethyldimethoxysilane or tetravinylsilane may be employed.

As described above, the present invention reduces the effective dielectric constant of the insulating film while maintaining better reliability of the semiconductor device, which otherwise may be deteriorated by a moisture absorption.

What is claimed is:

1. A semiconductor device comprising:
   a semiconductor substrate;
   a first insulating film formed on an upper side of said semiconductor substrate, said first insulating film consisting essentially of ladder-shaped siloxane hydride; and
   a second insulating film disposed adjacent to said first insulating film, said second insulating film containing oxygen and silicon as constituent elements.

2. The semiconductor device according to claim 1, wherein said second insulating film comprises a compound selected from the group consisting of SiO$_2$, SiOC, SiGN and SiOF.

3. The semiconductor device according to claim 1, further comprising a metal interconnect embedded in a multilayer structure, said multilayer structure comprising said first insulating film and said second insulating film.

4. The semiconductor device according to claim 1, wherein said semiconductor device is free of a guard ring.

5. The semiconductor device according to claim 1, wherein said ladder-shaped siloxane hydride has a dielectric constant of not higher than 2.9.

6. The semiconductor device according to claim 1, wherein said ladder-shaped siloxane hydride is a film being formed by being baked at a temperature within a range of from 200 degree C. to 400 degree C.

7. The semiconductor device according to claim 1, wherein said ladder-shaped siloxane hydride has a film density within a range of from 1.50 g/cm$^3$ to 1.58 g/cm$^3$.

8. The semiconductor device according to claim 1, wherein said ladder-shaped siloxane hydride has a refraction index at a wavelength of 633 nm within a range of from 1.38 to 1.40.

* * * * *